(12) United States Patent
Udayakumar et al.

(10) Patent No.: US 7,772,014 B2
(45) Date of Patent: Aug. 10, 2010

(54) SEMICONDUCTOR DEVICE HAVING REDUCED SINGLE BIT FAILS AND A METHOD OF MANUFACTURE THEREOF

(75) Inventors: Kezhakkedath R. Udayakumar, Dallas, TX (US); Ted S. Moise, Dallas, TX (US); Qi-Du Jiang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/845,834

(22) Filed: Aug. 28, 2007

(65) Prior Publication Data

US 2009/0057736 A1    Mar. 5, 2009

(51) Int. Cl.
*H01L 29/92* (2006.01)
(52) U.S. Cl. ............... 438/3; 257/295; 257/E21.208
(58) Field of Classification Search ............ 438/3, 438/758, 761, 197, 238; 257/295, 296, E21.459, 257/E21.46, E21.208
See application file for complete search history.

(56) References Cited

U.S. PATENT DOCUMENTS

| | | | | |
|---|---|---|---|---|
| 6,071,771 | A * | 6/2000 | Schuegraf | 438/240 |
| 6,271,136 | B1 * | 8/2001 | Shue et al. | 438/687 |
| 6,436,819 | B1 * | 8/2002 | Zhang et al. | 438/656 |
| 6,515,323 | B1 * | 2/2003 | Jung et al. | 257/295 |
| 6,902,939 | B2 | 6/2005 | Moise et al. | |
| 6,913,967 | B2 * | 7/2005 | Choi et al. | 438/240 |
| 6,998,275 | B2 | 2/2006 | Zhao et al. | |
| 2002/0036307 | A1 | 3/2002 | Song | |
| 2002/0072223 | A1 * | 6/2002 | Gilbert et al. | 438/629 |
| 2004/0178431 | A1 | 9/2004 | Moon et al. | |
| 2006/0073613 | A1 | 4/2006 | Aggarwal et al. | |
| 2008/0085611 | A1 * | 4/2008 | Khandelwal et al. | 438/785 |

OTHER PUBLICATIONS

Amato-Wierda et al., "Chemical vapor deposition of titanium nitride thin films from tetrakis(dimethylamido)titanium and hydrazine as a coreactant." Materials Research Society vol. 15, No. 11 (2000): pp. 2414-2424.*

* cited by examiner

*Primary Examiner*—Matthew Smith
*Assistant Examiner*—Michele Fan
(74) *Attorney, Agent, or Firm*—Rose Alyssa Keagy; W. James Brady; Frederick J. Telecky, Jr.

(57) ABSTRACT

One aspect of the invention provides a method of manufacturing a FeRAM semiconductor device having reduce single bit fails. This aspect includes forming an electrical contact within a dielectric layer located over a semiconductor substrate and forming a first barrier layer over the dielectric layer and the electrical contact. The first barrier layer is formed by depositing multiple barrier layers and densifying each of the barrier layers after its deposition. This forms a stack of multiple barrier layers of a same elemental composition. The method further includes forming a second barrier layer over the first barrier layer and forming a lower capacitor electrode, a ferroelectric dielectric layer over the lower capacitor, and forming an upper capacitor electrode over the ferroelectric dielectric layer. A device made by this method is also provided herein.

21 Claims, 7 Drawing Sheets

SEMICONDUCTOR DEVICE HAVING REDUCED SINGLE BIT FAILS AND A METHOD OF MANUFACTURE THEREOF

TECHNICAL FIELD

The disclosure is directed, in general, to a method of manufacturing a semiconductor device and more specifically to a semiconductor device having reduced single bit fails and a method of manufacture thereof.

BACKGROUND

Demand for electronic devices that include non-volatile memory, such as ferroelectric random access memory (FeRAM), has greatly increased. FeRAMS utilize a ferroelectric material, such as strontium bismuth tantalate (SBT) or lead zirconate titanate (PZT), as a capacitor dielectric situated between a lower electrode and an upper electrode. Both read and write operations can be performed on a FeRAM. FeRAMs also often include a titanium nitride (TiN) barrier layer that servers to inhibit diffusion of atoms from the SBT or PZT ferroelectric layers to the underlying contact or interconnect structure.

FeRAMS, however, can suffer from bit failure. A bit typically consists of a FeRAM capacitor electrically connected, typically by a contact plug, to a transistor. These "bits" are connected to a bit line. During testing, the charge on the FeRAM capacitor is transferred to the bit line. The transferred charge induces a voltage on the bit line, which is then detected by a comparator. If the voltage falls within the range assigned to a "1", then the comparator outputs a logical "1". Conversely, if the voltage falls within the range assigned to a "0", then the comparator outputs a logical "0". If the bit line voltage of a defective bit deviates and falls outside of the assigned range, the comparator may output an incorrect value. When this condition exists, a bit failure occurs. Such bit failures are undesirable because they can affect the overall yield and reliability of the device.

SUMMARY

In one embodiment of the invention there is provided a method of manufacturing a semiconductor device. This embodiment comprises forming transistors over a semiconductor substrate, forming a pre-metal dielectric layer over the transistors, forming electrical contacts in the pre-metal dielectric layer that electrically contact the transistors, and forming ferroelectric random access memory (FeRAM) capacitors over the dielectric layer. The formation of the FeRAM capacitors includes forming a first barrier layer over the electrical contact and the pre-metal dielectric layer by conducting deposition and densification of the titanium nitride layer, which forms a stack of multiple titanium nitride layers. A second barrier layer is formed over the first barrier layer, and the second barrier layer has an elemental composition different from the first barrier layer. A lower capacitor electrode is formed over the second barrier layer, and a ferroelectric dielectric layer comprising lead, zirconium and titanium is formed over lower capacitor. This embodiment further includes forming an upper capacitor electrode over the ferroelectric dielectric layer, forming interlevel dielectric layers over the FERAM capacitors, and forming interconnects over and within the interlevel dielectric layers to interconnect the transistors and capacitors.

Another embodiment provides a method of manufacturing ferroelectric random access memory (FeRAM) capacitors. This embodiment includes forming an electrical contact within a dielectric layer located over a semiconductor substrate and forming a first barrier layer, comprising a stack of multiple barrier layers, over the dielectric layer and the electrical contact by depositing each of the barrier layers and densifying each of the barrier layers after its deposition. The same deposition process is used to form each of the layers. The method further includes forming a second barrier layer over the first barrier layer, forming a lower capacitor electrode over the second barrier layer, forming a ferroelectric dielectric layer over the lower capacitor, and forming an upper capacitor electrode over the ferroelectric dielectric layer.

In another embodiment, there is provided a semiconductor device. The device comprises transistors located over a semiconductor substrate, a pre-metal dielectric layer located over the transistors, electrical contacts located in the pre-metal dielectric layer that electrically contact the transistors and a ferroelectric random access memory (FeRAM) capacitors located over the pre-metal dielectric layer. The FeRAM capacitors include a first barrier layer located over the electrical contacts and the pre-metal dielectric layer, wherein the first barrier layer is a stack of multiple barrier layers having a same elemental composition and have interfaces located therebetween. The device further includes a second barrier layer located over the first barrier layer that has an elemental composition different from the first barrier layer. A lower capacitor electrode is located over the second barrier layer, a ferroelectric dielectric layer is located over the lower capacitor, and an upper capacitor electrode is located over the ferroelectric dielectric layer. Interlevel dielectric layers are located over the FERAM capacitors, and interconnects are located over and within the interlevel dielectric layers that interconnect the transistors and capacitors.

BRIEF DESCRIPTION OF DRAWINGS

The disclosure is described with reference to example embodiments and to accompanying drawings, wherein.

DETAILED DESCRIPTION

Figure 1:
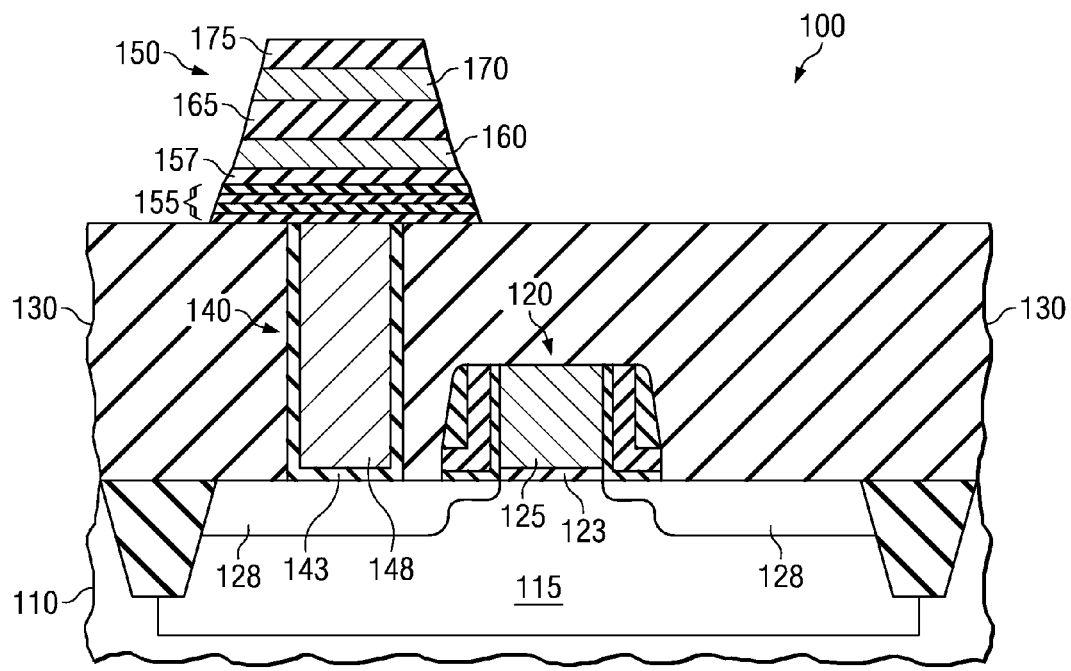
FIG. 1 illustrates a semiconductor device that can be made using the principles of the invention.

FIG. 1 illustrates one embodiment of a ferroelectric random access memory (FeRAM) device 100 constructed according to certain embodiments of the invention. In the embodiment illustrated in FIG. 1, the FeRAM 100 includes a substrate 110. A well region 115 is located within the substrate 110, and a transistor 120 is located over the substrate 110.

The transistor 120 may be conventionally formed over the substrate 110 and may include a gate oxide 123 that is located over the substrate 110, as well as a gate electrode 125 located over the gate oxide 123. Sidewall spacers flank both sides of the gate electrode 125 and gate oxide 123. The transistor 120 may further include conventional source/drain regions 128 located within the substrate 110. The source/drain regions 128 may each include a lightly doped extension implant as well as a higher doped source/drain implant.

In the illustrated embodiment, a pre-metal dielectric layer 130 is located over the transistor 120. The pre-metal dielectric layer 130 may be any insulative material known for use in a semiconductor device. As used herein, the pre-metal dielectric layer 130 is the dielectric layer on which metal interconnects lines may be or are formed. Any dielectric layers deposited subsequent to the pre-metal dielectric layer 130 are considered to be interlevel dielectric layers for purposes herein. Located within the pre-metal dielectric layer 130 is an interconnect 140, such as a contact plug. The interconnect 140 may include an optional barrier layer 143 and a conductive plug 148. The conductive plug 148 may comprise tungsten and the barrier layer 143 may comprise a Ti/TiN stack. Other materials, however, could be used. The interconnect 140 optimally contacts the drain region of the source/drain regions 128. The interconnect 140 may be of different types, including a damascene for dual damascene configuration.

A ferroelectric capacitor 150, such as a FeRAM capacitor, is located over transistor 120 and contacts the interconnect 140. The ferroelectric capacitor 150 in the embodiment of FIG. 1 includes a first barrier layer 155 that is a stack of multiple layers located over interconnect 140 and the pre-metal dielectric layer 130. In one embodiment, the stack may include two to six or more layers, and in a more specific embodiment, it includes four layers. This embodiment also includes a second barrier layer 157 that has a different elemental composition different from the multi-layered barrier layer 155; that is, all of the atomic elements in the first and second layers 155, 157 are not the same. For example, each of the layers in the first barrier layer 155 may have an elemental composition that contains titanium and nitrogen, while the second barrier 157 may have an elemental composition that contains titanium, aluminum, and nitrogen. These elements are given as examples, and it should be understood that other elemental combinations used for barrier purposes in semiconductor devices may also be used. Moreover, other embodiments include instances where the elemental composition of both the first and second barrier layers 155, 157 is the same, excluding any impurities or trace elements. The stack of the first barrier layer 155 provides benefits over conventional ferroelectric capacitors, as discussed in more detail below.

The ferroelectric capacitor 150 further includes a lower electrode 160, which may include more than one layer, located over the second barrier layer 157. Conventional processes may be used to form the electrode layer 160, and it may comprise a number of different materials while staying within the scope of the invention. For example, the electrode 160 may comprise iridium or noble metals.

A ferroelectric dielectric layer 165 is located over the lower electrode and in one embodiment, may comprise a perovskite material, such as lead zirconate titanate (PZT), strontium bismuth tantalate (SBT) or other similar materials. Located over the ferroelectric dielectric layer 165 is an upper electrode 170, which may have the same composition as the lower electrode 160, or it may include an oxide of the metal that comprises the electrode. For instance, the lower electrode 160 may be iridium, while the upper electrode 170 may include both iridium and iridium oxide.

A protective layer 175 that is located over the electrode 170 may also be included in the structure. It should be noted that other layers may also be included in the ferroelectric capacitor 150, as design may require and is not limited to the illustrated embodiment.

The multi-layered barrier layer 155 provides benefits over conventional devices. For example, it has been found that the multi-layered barrier layer 155 reduces blistering that occurs as a result of the barrier layer being deposited over the interconnect 140. In conventional processes, a single barrier layer is typically used and formed over the pre-metal dielectric layer and the interconnect or contact plug. In such instances, the upper portion of the contact plug may have a dip in its center, which can cause blistering of the barrier layer. It has been found that forming the barrier layer 155 in separate, multiple layers by cycling deposition and densification processes, reduces blistering of the barrier layer 155. Furthermore, and as equally beneficial, it has been unexpectedly found that forming the barrier layer 155 in this way also reduces bit fails within the device. This is beneficial because reduced bit fails increase both yield and reliability of the device.

FIGS. 2A-2D and 4-9 illustrate views of selected manufacturing steps instructing how one might, in one embodiment, manufacture a FeRAM 100 depicted in FIG. 1. The FeRAM 200 of FIG. 2A includes a substrate 210. The substrate 210 may be a doped region of a semiconductor wafer or a layer located over the wafer (e.g., epitaxial layer). A transistor 220, which may be conventionally designed and fabricated, is located over the substrate 210. As used here, the word "over" includes those instances where any portion of the transistor 220 is supported by or formed in the substrate 210. The transistor 220 includes a gate dielectric 223, a gate electrode 225 (e.g., polycrystalline silicon doped either p-type or n-type with a silicide formed on upper or a metal such as titanium, tungsten, TiN, tantalum, TaN), and side wall insulators. Source/drain regions 228 are preferably implanted using conventional dopants and processing conditions. Lightly doped drain extensions as well as pocket implants may also be utilized. In addition, the source/drain regions 228 may be silicided (preferably with titanium, cobalt, nickel, tungsten or other conventional silicide material).

A pre-metal dielectric layer 230, which may be conventionally formed, is located over the entire substrate 210 and over the transistor 220, which includes those instances where the layer 230 is located directly on the substrate 210 and the transistor. The pre-metal dielectric layer 230 may be comprised of a number of dielectric materials, such silicon oxide, carbides, nitrides, or low-K polymer materials, all of which are well known, and one or more layers.

Located within the dielectric layer 230 is an interconnect 240, such as a contact plug, that contacts and makes electrical contact with the transistor 220 and is thus associated therewith. To form the interconnect 240 the dielectric layer 230 is patterned and etched to form an opening for contact to the substrate 210. An optional barrier layer 243 may be formed to line the opening. The opening is then filled with one or more conductive materials, such as a conductive plug 248 (e.g., tungsten, molybdenum, titanium, titanium nitride, tantalum nitride, metal silicide, such as Ti, Ni or Co, copper or doped polysilicon). Often during the conductive plug's formation, a dip can form in the upper surface of the plug. The presence of this dip can cause blistering of subsequently deposited FeRAM capacitor barrier layers, which lie over both the dielectric layer 230 and the conductive plug 248. Thus, it is beneficial to provide a barrier layer that does not blister and one that provides reduced bit fails.

Figure 2A:
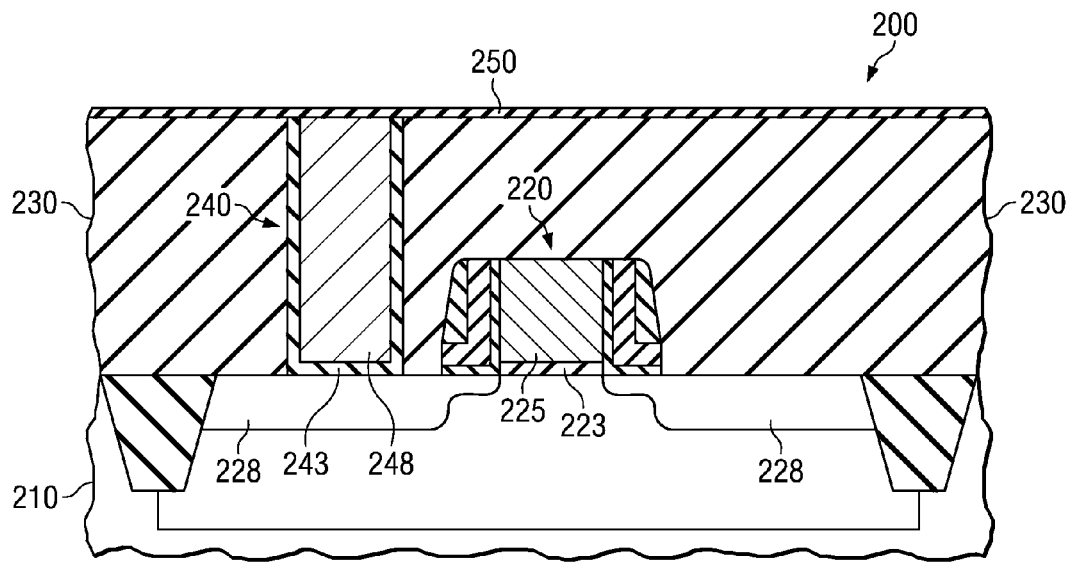
FIGS. 2A-2D and 4-9 illustrate various fabrication steps used to construct the semiconductor device of FIG. 1.

FIG. 2A further illustrates the deposition of a first barrier layer 250, one of which forms the barrier stack 155 of FIG. 1. The layer 250 may be deposited using an enhanced chemical vapor deposition process, such as a Metal Organic Chemical Vapor Deposition (MOCVD) process. In one embodiment, MOCVD may be used to deposit the layer 250, an example of which may be a titanium nitride layer. One embodiment includes cycling layer deposition and densification steps. A general example of the process proceeds as follows. After the semiconductor wafer is transferred to the CVD chamber, it sits on the heater that is held at about 450° C. The temperature is allowed to stabilize at a deposition temperature ranging from about 340° C. to about 540° C. Other diluent gases, e.g., helium and nitrogen, are introduced into the CVD chamber at flow rates ranging from about 200 sccm to about 400 sccm, and the chamber pressure is stabilized to a pressure ranging from about 0.8 Torr to about 2 Torr. A metal organic precursor, such as tetrakis(dimethylamido)titanium (TDMAT), is introduced with helium as a carrier gas into the chamber to begin film deposition at a flow rate ranging from about 190 sccm to about 250 sccm. Other materials, such as tantalum silicon nitride, silicon nitride, titanium silicon nitride, tantalum nitride, hafnium nitride, zirconium nitride, or chromium nitride, may be used in place of the TDMAT. The deposition ends when the precursor gas flowing to the chamber is stopped or substantially stopped such that deposition is no longer occurring. In certain embodiments, the as-deposited layer 250 is amorphous and where TDMAT is used, the layer 250 may be an amorphous $TiN_xC_yH_z$ layer. The deposition time will depend on the targeted thickness.

Following the deposition, the wafer remains in the chamber for the densification process. Nitrogen and hydrogen gases are introduced at rates ranging from about 200 sccm to about 600 sccm for nitrogen and about 0 sccm to about 500 sccm for hydrogen and the chamber pressure is stabilized. The plasma is introduced to the chamber by using a radio-frequency power ranging from about 500 watts to about 880 watts to begin densification of the layer 250.

It should be noted that the thickness of each of the layers of the barrier layer 155 (FIG. 1) may vary, and the layers thickness prior to densification is referred to herein as a pre-densification thickness, and the thickness of these layers after densification is referred to herein as a post-densification thickness. For example, in one embodiment, the layer 250 is deposited to a pre-deposition thickness of about 75 angstroms. During the densification process, the layer's 250 thickness may decrease by as much as 50% to about 40 angstroms due to the fact that the plasma densification reduces impurity components, e.g., carbon and oxygen, and the layer 250 is transformed into polycrystalline form. In the fabrication test samples, a post-densification thickness of 40 angstroms achieved after a 35 second densification plasma process showed good improvement in the reduction of impurity content and reduction in blistering and an unexpected reduction in fail bit rates. It is believed that this thickness allows the plasma used in subsequent densification steps to penetrate through the newly deposited film into any previously deposited films of the stack and achieved the observed beneficial improvements.

Figure 2B:
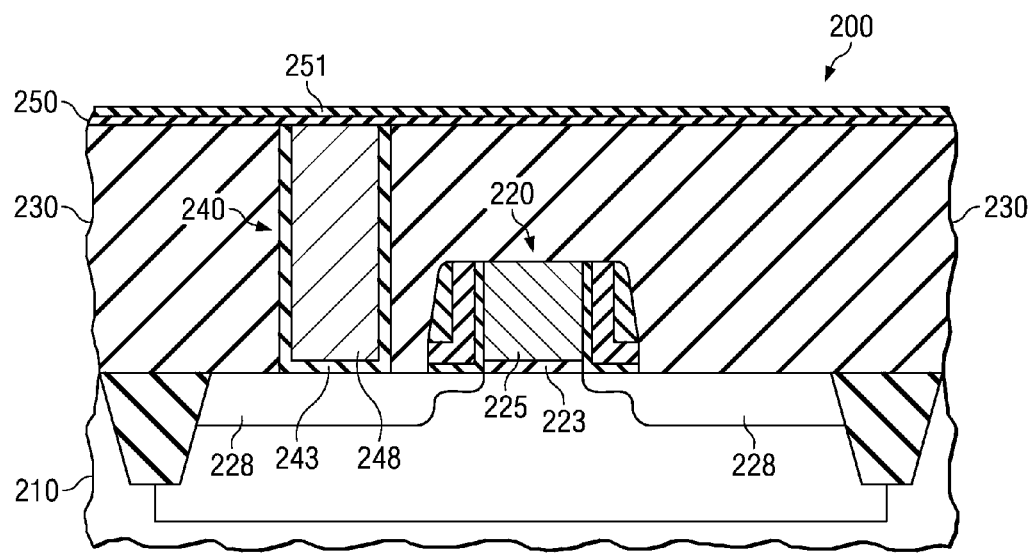

Following the densification of layer 250, another deposition cycle is conducted to form a second barrier layer 251 over the first barrier layer 250, as shown in FIG. 2B. As with the first barrier layer 250, the second barrier layer 251 is deposited using deposition and densification cycles. The deposition and densification cycles may be the same as those used to form layer 250 or they be different as to time, process conditions, or materials used. Moreover, the same above-discussed deposition and densification processes used to form layer 250 may also be used to form barrier layer 251. Even in those embodiments where the deposition and densification processes are the same for each layer, the atomic percentages of the impurities in layer 251 that result from the deposition may vary from layer 250. This can occur when impurities from layer 251 diffuse into layer 250 during the deposition and densification of layer 251, thereby changing the impurity concentration, which can also form an impurity gradient within layer 251. This provides a compositional modulation that may also be another reason for the reduction in bit failures.

Figure 2C:
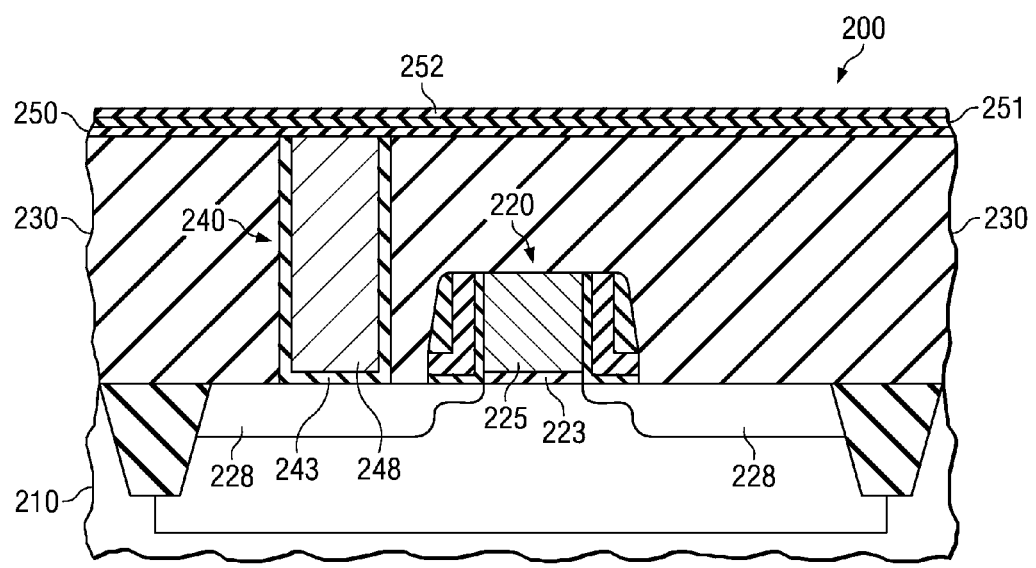

Following the densification of layer 251, another deposition cycle is conducted to form a third barrier layer 252 over the second barrier layer 251, as shown in FIG. 2C. As with the first and second barrier layers 250, 251, the third barrier layer 252 is deposited using deposition and densification. Moreover, the same above-discussed deposition and densification processes used to form layers 250 and 251 may also be used to form barrier layer 252, or they may be different. Also, even if the same deposition and densification processes are used, the atomic percentages of the impurities in layer 252 that result from the deposition and densification may vary from layer 251 for the same reasons noted above, thereby changing the impurity concentration, which can also form an impurity gradient within layer 252. This provides a compositional modulation in layer 252 that may also be a reason for the reduction in bit failures.

Figure 2D:
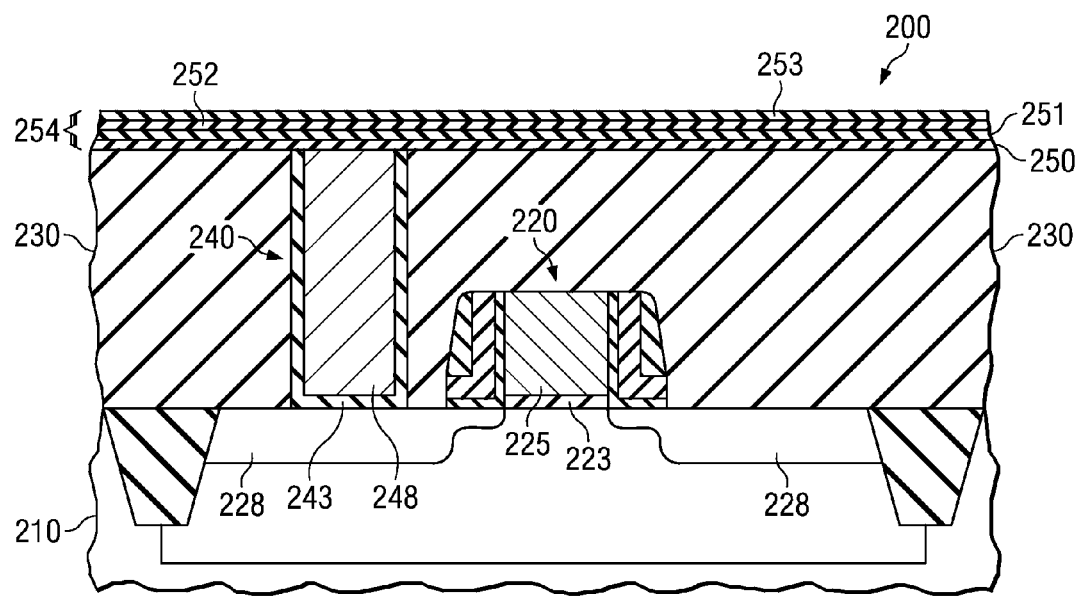

Following the densification of layer 252, another deposition cycle is conducted to form a fourth barrier layer 253 over the third barrier layer 252, as shown in FIG. 2D. As with the first, second, and third barrier layers 250, 251, 252, the fourth barrier layer 253 is deposited using a deposition process followed by a densification step. Moreover, the same above-discussed deposition and densification processes used to form layers 250, 251, and 252 may also be used to form barrier layer 253, or they may be different. Also, even if the same deposition and densification processes are used, the atomic percentages of the impurities in layer 253 that result from the deposition and densification may vary from layer 250, 251, and 252 for the same reasons noted above, thereby changing the impurity concentration, which can also form an impurity gradient within layer 253. This provides a compositional modulation in layer 253 that may also be a reason for the reduction in bit failures. In this embodiment, barrier layers 250, 251, 252, and 253 collectively form a first barrier layer 254 for a FeRAM capacitor.

Test results show that the densification process of the thinner films provides a larger reduction in impurities than offered by conventional processes. For example, when a conventional single 100 angstrom thick barrier layer was formed, the average carbon and oxygen atomic percent (i.e., percentage of the number of atoms) content within the layer was about 7.4% and 12.8% respectively. Moreover, this film had a higher resistivity of about 501 micro ohms centimeter. In contrast, the multi-layered barrier layer provided by embodiments covered by the invention showed improvements in both impurity content and resistivity. For example, in one embodiment that included two barrier layers, the stack had an average atomic percent of carbon of less than about 4.5% and an average atomic percent of oxygen of less than about 2.4% where each of the two layers had a post-densification thickness of about 40 angstroms. The resistivity of this stack was about 269 micro ohms centimeter. In another embodiment that included four deposited layers, the stack had an average atomic percent of carbon of less than about 3.3% and an average atomic percent of oxygen of less than about 1.0%, where each of the four layers had a post-densification thickness of about 40 angstroms. The resistivity of this stack was about 183 micro ohms centimeter. The reduced impurity content within the stacked barrier layer is believed to be another reason for the reduced bit failure within the device.

The embodiment discussed above shows four different layers comprising the first barrier layer 254. However, it should be understood that the first barrier layer 254 may be comprised of any number of multiple layers. For example, the first barrier layer 254 may be comprised of two to six individual layers, or more in other embodiments.

Another benefit of the invention is that the deposition and densification cycles form interfaces between the various layers of the first barrier layer 254, represented as the solid lines located between each of the layers 250 through 253. It is believed that these interfaces provide an enhanced barrier to limit the diffusion of elements (e.g., lead, zirconium, oxygen) out of the ferroelectric capacitor layer 610. It also provides an enhanced barrier to limit diffusion of metal elements from the contacts into the ferroelectric capacitor, both of which can degrade the ferroelectric properties.

A layer, as used herein, is a portion of a material that is terminated by an interface. An interface is a region having a discontinuity of characteristics of the material, such as, e.g., density, conductivity, permittivity, or permeability. An interface may be with respect to a different material or phase, or to a nominally identical material. In some cases the discontinuity may result from physical relaxation of the material in close proximity to the interface to reduce the free energy of a surface after formation of the layer. Relaxation may include, e.g., changes of distances between atoms, or rearrangement of atomic bonds to reduce dangling bonds at the surface. A buried interface may be present between multiple layers of a nominally identical material where formation of an underlying layer ends and formation of an overlying layer begins after a period of time during which relaxation of the surface of the underlying layer occurs. The buried interface may be detected by, e.g. transmission electron microscopy, and may present itself as, e.g., dislocations in a crystalline material, or a line of differing electron transmission contrast.

As discussed above, the first barrier layer 254, as provided herein, shows an unexpected improvement over using a single layer as the barrier layer. In experiments that were conducted comparing a single 100 angstrom barrier layer to the multilayer barrier layer comprising two or more layers, the bit fails rates were unexpectedly improved. This improvement is shown in FIG. 3.

Figure 3:
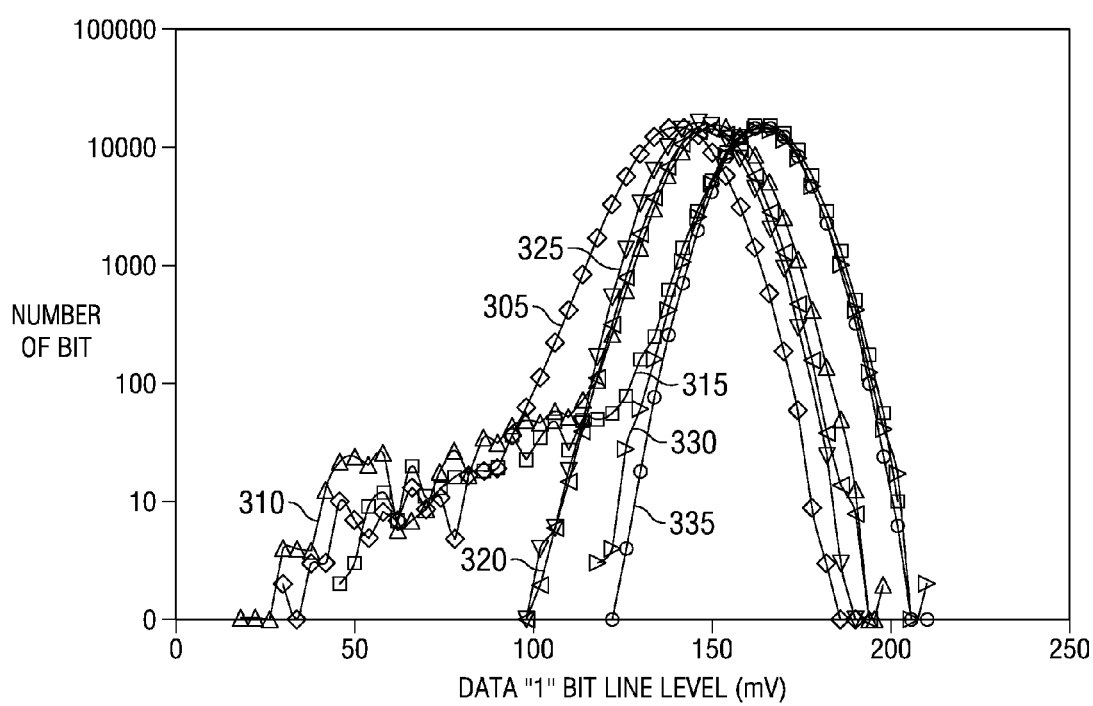
FIG. 3 compares graphs of Numbers of Bits versus Data Bit "1" line voltage of wafers having conventional FeRAM devices formed thereon with wafers having FeRAM devices formed thereon using the principles of embodiments of the invention.

FIG. 3 compares three different wafers having FeRAM capacitors thereon fabricated using a single 100 angstrom barrier layer. These wafers are represented by the graphs designated 305, 310, and 315 and were compared to four different wafers having FeRAM capacitors thereon fabricated using the principles of the invention. The wafers containing the FeRAM capacitors fabricated in accordance with the embodiments discussed herein are represented by the graphs designated 320, 325, 330, and 335. In the samples, bit failures occurred when the voltage on the "1" bit line fell below about 50 mV. Each of the FeRAM capacitors and associated transistor, which is the transistor to which the capacitor is electrically connected, formed a bit that was connected to a bit line. Each of the wafers contained a total population of these bits that had a polarization in micro coulombs/cm$^2$ associated therewith and wherein a bit with the lowest data "1" value had a polarization that is within 40% of the data "1" peak polarization. As seen in FIG. 3, the wafers 320, 325, 330, and 335 showed a reduction in the number of bit failures when compared to wafers 305, 310, and 315. In fact, there were virtually no bit failures. When the devices were made in accordance with the principles of the invention as represented by the embodiments discussed herein, an unexpected improvement occurred in the number of bit failures as compared to conventionally formed devices.

Figure 4:
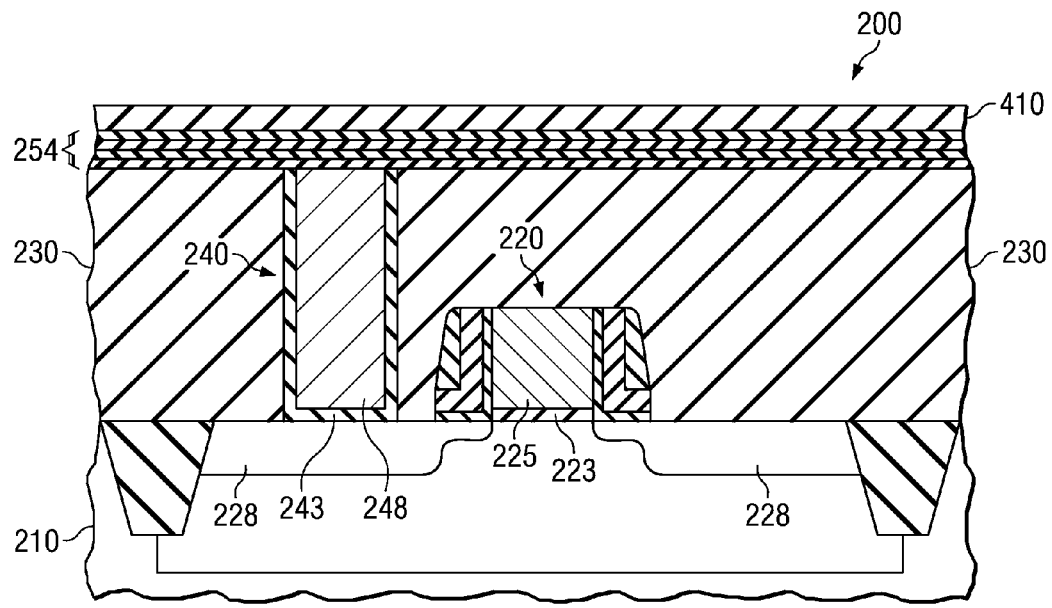

A second, optional barrier layer 410 may be conventionally formed over the first, stacked barrier layer 254, as shown in FIG. 4. In one embodiment that includes the second barrier layer 410, the second barrier layer has an elemental composition that is difference from the layers of the first barrier layer 254; that is the second barrier layer 410 contains elemental atoms that are not in the first barrier layer 254, excluding depositional impurities. For example, the second barrier layer 410 may be comprised of titanium aluminum nitride, titanium aluminum, hafnium aluminum nitride, tantalum aluminum nitride or chromium aluminum nitride, while the first barrier layer 254 may comprise titanium nitride, tantalum nitride, hafnium nitride or chromium nitride. In another embodiment, however, the second barrier layer 410 may have the same elemental composition, excluding impurities, as the first barrier layer 254. In addition, in certain embodiments, the second barrier layer 410 may also be formed in the same manner as the first barrier layer 254. The thickness of this layer may be about 500 angstroms or more (e.g., 1000 angstroms or greater).

Figure 5:
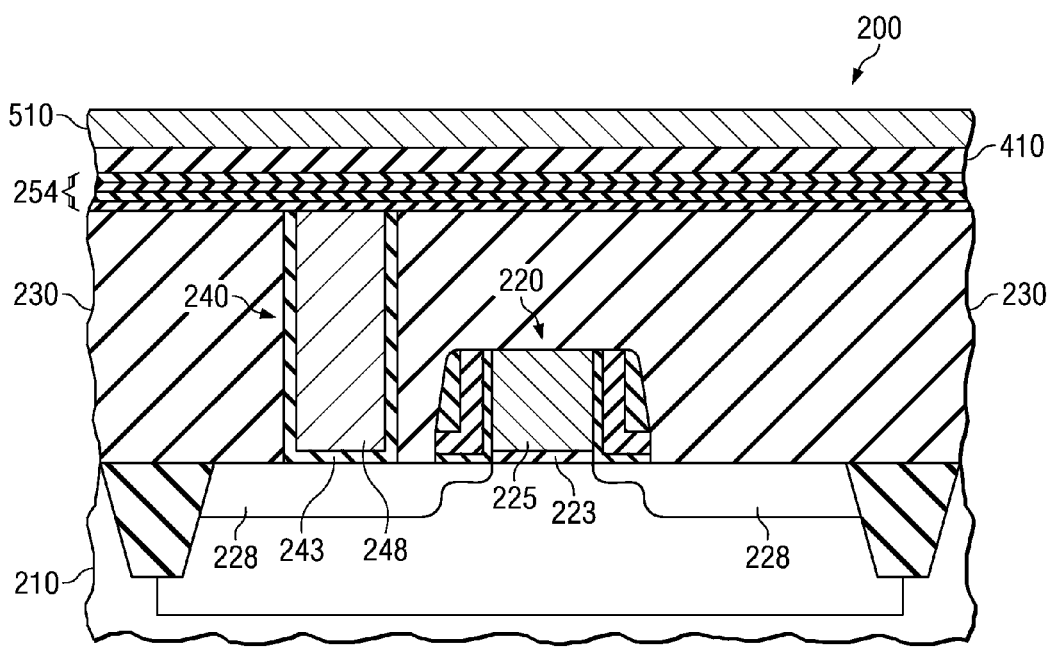

FIG. 5 illustrates the device 200 of FIG. 4 after the formation of a lower electrode 510 over the optional second barrier layer 410. The lower electrode 510, in one embodiment, may be a single layer or may comprise more than one layer. Conventional process may be used to form the lower electrode 510 and may have a thickness ranging from about 200 angstroms to about 1000 angstroms. In one embodiment, the lower electrode layer 510 is stable in oxygen and may comprise a noble metal such as Ir, Ru, or Pd.

Figure 6:
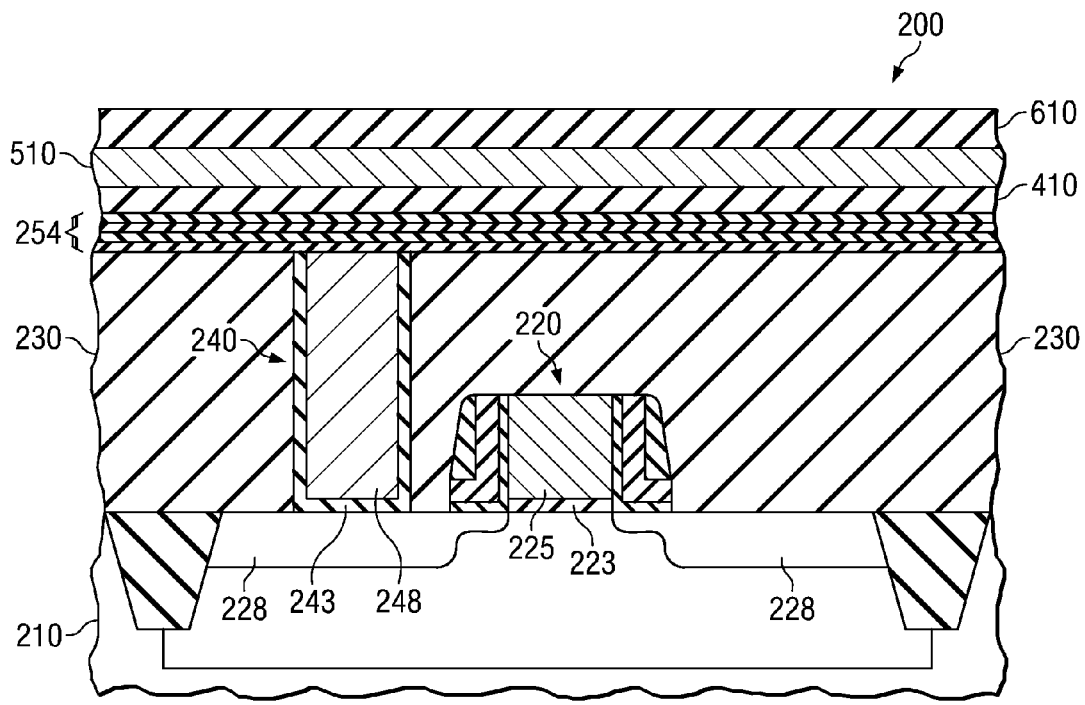

FIG. 6 illustrates the device of FIG. 5 after the formation of a ferroelectric dielectric layer 610 over the lower electrode 510. The ferroelectric dielectric layer 610 may have a thickness of about 750 angstroms, though the thickness may vary, depending on design. The dielectric layer 610 may comprise a wide range of ferroelectric materials. For example, the dielectric layer 610 may comprise materials, such as lead zirconate titanate (PZT); doped PZT with donors (Nb, La, Ta), acceptors (Mn, Co, Fe, Ni, Al), and/or both; PZT doped and alloyed with $SrTiO_3$, $BaTiO_3$ or $CaTiO_3$. Alternatively, the dielectric layer 610 may comprise strontium bismuth tantalate (SBT) and other layered perovskites such as strontium bismuth niobate tantalate (SBNT); or bismuth titanate; $BaTiO_3$; $PbTiO_3$; or $Bi_2TiO_3$.

In one specific embodiment, the dielectric layer 610 comprises PZT because it has the highest polarization and the lowest processing temperature of the aforementioned materials. In addition, the preferred Zr/Ti composition is around 25/75, respectively, in order to obtain good ferroelectric switching properties (large switched polarization and relatively square-looking hysterisis loops). Alternatively, Zr/Ti compositions of approximately 65/35 may be used to maximize uniformity in capacitor properties. The donor dopant may improve the reliability of the PZT by helping to control the point defect concentrations.

Conventional deposition processes, such as MOCVD may be used to deposit the ferroelectric dielectric layer 610, and it may be deposited in either a single crystalline/poly-crystalline state or it can be deposited in an amorphous phase at low temperatures and then crystallized using a post-deposition anneal. This is commonly done for Bi ferroelectric films. The post deposition crystallization anneal can be performed immediately after deposition or after later process steps such as electrode deposition or post capacitor etch anneal. The MOCVD PZT approach results in a poly-crystalline film completely formed using temperatures of about 500° C. or less.

Figure 7:
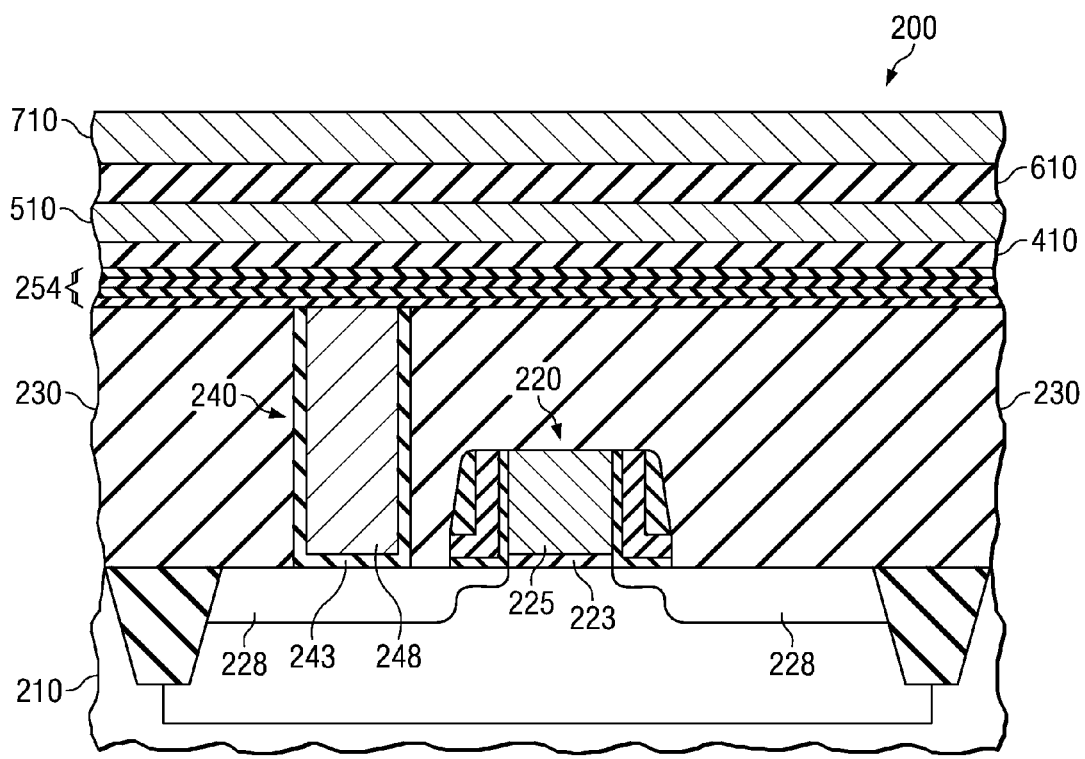

FIG. 7 illustrates the device 200 of FIG. 6 after forming an upper electrode 710 over the ferroelectric dielectric layer 610. Conventional processes and materials may be used to form the upper electrode 710. The upper electrode 710 may be a single layer or may also include an oxide layer. When present, the oxide layer may comprise an oxide of the metal used to form the upper electrode 710. For example, the upper electrode 710 may comprise a noble metal, such as iridium, while the oxide layer may be iridium oxide.

Figure 8:
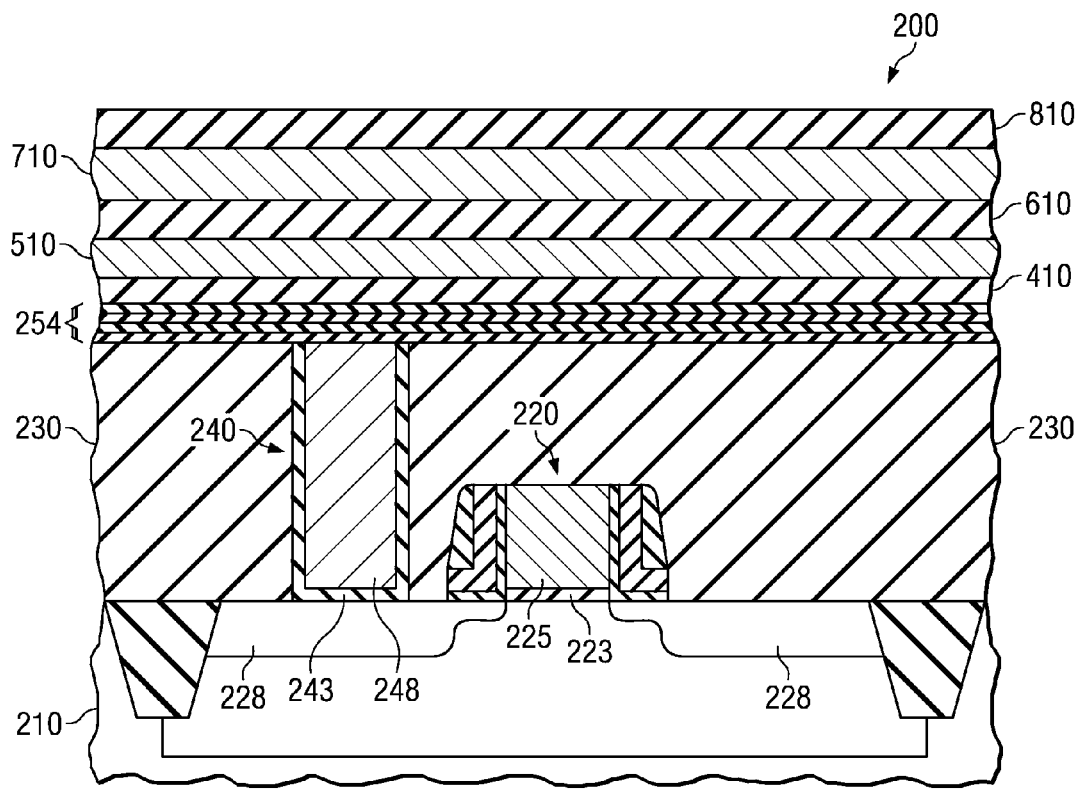

FIG. 8 illustrates the device 200 of FIG. 7 after the formation of a protective layer 810. The protective layer 810 may comprise a material which is thick enough to retain its integrity during a subsequent etch process. The protective layer 810 may have a thickness ranging from about 500 angstroms to about 5000 angstroms and may comprise TiAlN, TiN, Ti, $TiO_2$, Al, $AlO_x$, AiN, TiAl, $TiAlO_x$, Ta, $TaO_x$, TaN, Cr, CrN, $CrO_x$, Zr, $ZrO_x$, ZrN, Hf, HfN, $HfO_x$, silicon oxide, low-k dielectric, or any stack or combination thereof. An example of the protective layer 810 is a deposited $SiO_2$ on a TiAlN or TiN layer. The protective layer 810 thickness is controlled by the etch process and the relative etch rates of the various materials, the thicknesses of the etched layers, the amount of overetch required, and the desired remaining protective layer 810 thickness after etching all of the layers.

The protective layer 810 may or may not be removed after the etching of the capacitor stack. If the protective layer 810 is not removed, then it is preferable to form it of a conductive material. However, a non-conductive or semiconductive material may be used, but the interconnection to the upper electrode 710 may be formed through this layer to make direct connection to the second electrode 710.

Figure 9:
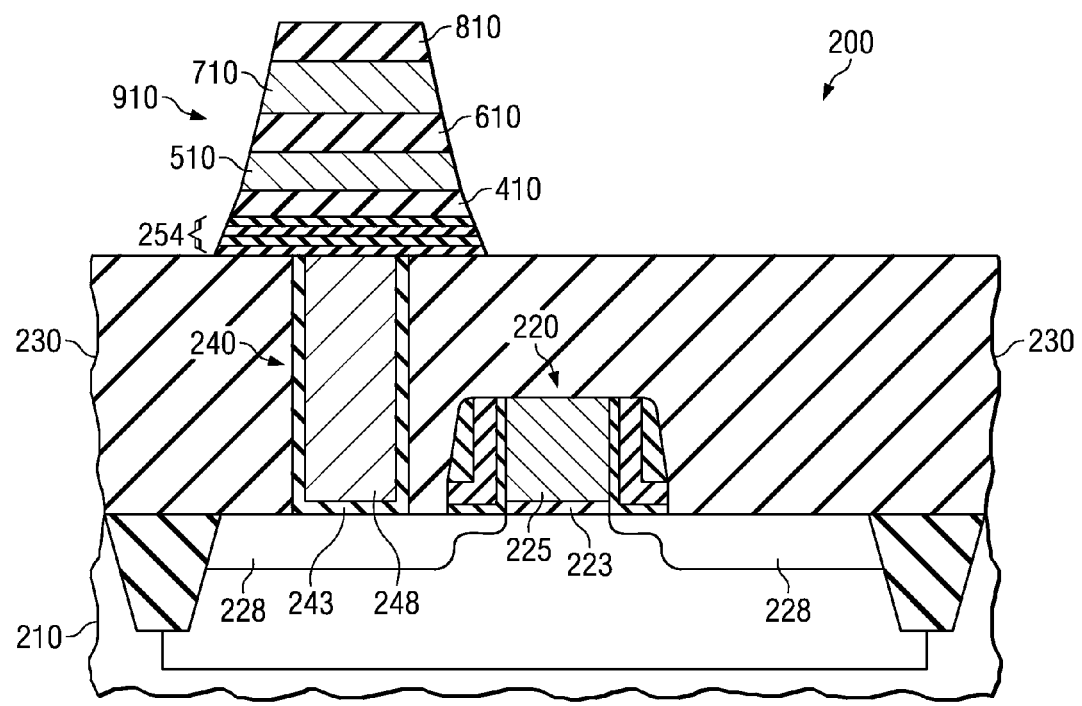

FIG. 9 illustrates the FeRAM device 200 of FIG. 8 after defining the first barrier layer 254, the second optional barrier layer 410, the lower electrode 510, the ferroelectric dielectric layer 610, the upper electrode 710 and the protective layer 810 to form a ferroelectric capacitor 910. Conventional processes may be used to define the ferroelectric capacitor 910. Using such conventional processes may form steep sidewalls as shown in FIG. 9. Thus, a sidewall diffusion barrier, not shown, may be formed on the completed ferroelectric capacitor 910 prior to the formation of another interlevel dielectric thereover. The sidewall diffusion barrier allows for the misalignment of the interconnect without shorting the capacitor, it protects the capacitor from the diffusion of most substances into the capacitor and protects the rest of the structures from the out-diffusion of substances from the capacitor. The sidewall diffusion barrier often comprises two layers, but the sidewall diffusion barrier may be comprised of more or fewer layers and stay within the scope of the present invention. The first layer may comprise $AlO_x$, $Ta_2O_5$, AlN, $TiO_2$, $ZrO_2$, $HfO_2$, or any stack or combination thereof; and the second layer may comprise silicon nitride, AlN, or any stack or combination thereof.

Figure 10:
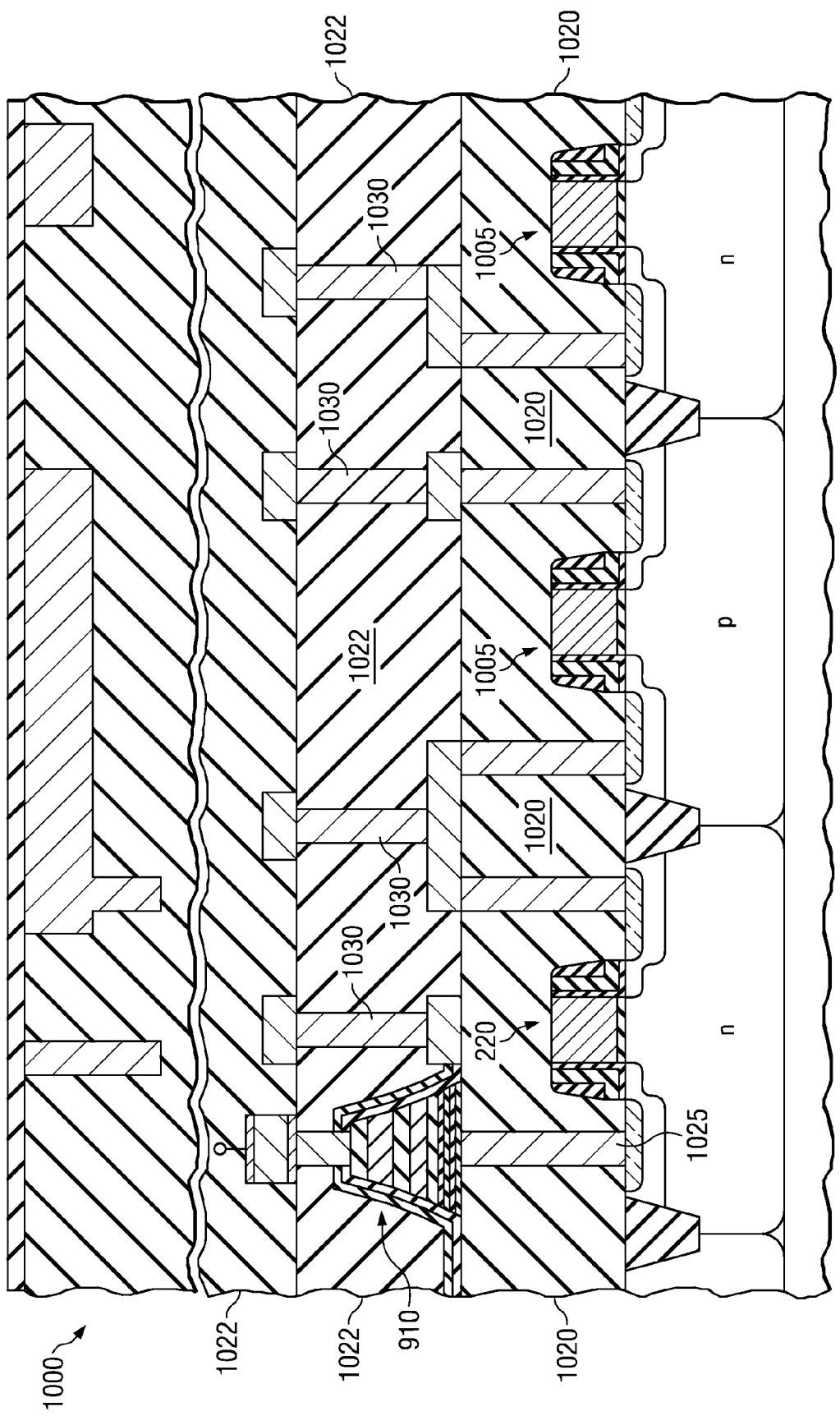
FIG. 10 illustrates an integrated circuit (IC) incorporating the semiconductor device of FIG. 1.

FIG. 10 illustrates an IC 1000 incorporating the ferroelectric capacitor 910 and associated transistor 220 as discussed above. The IC 1000 may also include devices, such as transistors 1005 used to form CMOS devices, BiCMOS devices, Bipolar devices, as well as capacitors or other types of devices. The IC 1000 may further include passive devices, such as inductors or resistors, or it may also include optical devices or optoelectronic devices. Those skilled in the art are familiar with these various types of devices and their manufacture. In the embodiment illustrated in FIG. 10, the IC 1000 includes the ferroelectric capacitor 910 having a pre-metal dielectric layer 1020 located thereunder and interlevel dielectric layers 1022 located thereover. Additionally, interconnect structures 1030, such as damascene or dual damascene interconnects, are located within the dielectric layers 1022 to interconnect various devices. Specifically, interconnect structure 1025 connects the ferroelectric capacitor 910 to source/drain regions of its associated transistor 220.

Those skilled in the art to which the disclosure relates will appreciate that other and further additions, deletions, substitutions, and modifications may be made to the described example embodiments, without departing from the disclosure.

What is claimed is:

1. A method of manufacturing a semiconductor device, comprising:
   forming transistors over a semiconductor substrate;
   forming a pre-metal dielectric layer over the transistors;
   forming electrical contacts in the pre-metal dielectric layer that electrically contact the transistors;
   forming ferroelectric random access memory (FeRAM) capacitors over the dielectric layer, including:
   forming a first barrier layer of the FeRAM capacitors over the electrical contact and the pre-metal dielectric layer by conducting deposition and densification of a titanium nitride layer, wherein the first barrier layer of the FeRAM capacitors is a stack of multiple densified titanium nitride layers;
   forming a second barrier layer over the first barrier layer such that the first and second barrier layers are located over the electrical contact and the pre-metal dielectric layer, the second barrier layer having an elemental composition different from the first barrier layer;
   forming a lower capacitor electrode over the second barrier layer;
   forming a ferroelectric dielectric layer comprising lead, zirconium and titanium over the lower capacitor; and
   forming an upper capacitor electrode over the ferroelectric dielectric layer;
   forming interlevel dielectric layers over the FeRAM capacitors; and
   forming interconnects over and within the interlevel dielectric layers to interconnect the transistors and FeRAM capacitors.

2. The method of claim 1, wherein the stack has an atomic percent of carbon of less than about 4.5% and an atomic percent of oxygen of less than about 2.4%.

3. The method of claim 1, wherein the stack has an atomic percent of carbon of less than about 3.3% and an atomic percent of oxygen of less than about 1.0% and includes 4 layers of titanium nitride each having a post-densification thickness of about 40 angstroms.

4. The method of claim 1, wherein conducting cycles of titanium nitride layer deposition includes introducing metalorganic tetrakis(dimethylamido)titanium (TDMAT) into a deposition chamber and forming an amorphous layer comprising $TiN_xC_yH_z$.

5. The method of claim 4, wherein conducting cycles of densification includes subjecting each titanium nitride layer to a plasma for about 35 seconds and re-crystallizing the amorphous layer.

6. The method of claim 1, wherein forming the stack forms interfaces between the multiple titanium nitride layers.

7. The method of claim 1, wherein forming the stack includes depositing two to six titanium nitride layers each having a pre-densification thickness of about 75 angstroms and post-densification thickness of about 40 angstroms.

8. The method of claim 1, wherein the second barrier layer is formed by a deposition and densification process.

9. The method of claim 1, wherein the second barrier layer comprises titanium aluminum nitride.

10. The method of claim 1, wherein the titanium nitride layers comprise $TiN_xC_yH_z$.

11. A method of manufacturing ferroelectric random access memory (FeRAM) capacitors, comprising:
- forming an electrical contact within a dielectric layer located over a semiconductor substrate;
- forming a first barrier layer of the FeRAM capacitors, comprising a stack of multiple barrier layers, over the dielectric layer and the electrical contact by depositing each of the multiple barrier layers and densifying each of the multiple barrier layers after its respective deposition, each of the multiple barrier layers formed by a same deposition process;
- forming a second barrier layer over the first barrier layer such that the first and second barrier layers are located over the dielectric layer and the electrical contact;
- forming a lower capacitor electrode over the second barrier layer;
- forming a ferroelectric dielectric layer over the lower capacitor; and
- forming an upper capacitor electrode over the ferroelectric dielectric layer.

12. The method of claim 11, wherein the stack has an atomic percent of carbon of less than about 4.5% and an atomic percent of oxygen of less than about 2.4%.

13. The method of claim 11, wherein the stack has an atomic percent of carbon of less than about 3.3% and an atomic percent of oxygen of less than about 1.0% and wherein the stack includes 4 layers.

14. The method of claim 13, wherein each of the barrier layers has a post-densification thickness of about 40 angstroms.

15. The method of claim 11, wherein depositing with chemical vapor deposition includes introducing metalorganic tetrakis(dimethylamido)titanium (TDMAT) into a deposition chamber and forming a layer comprising $TiN_xC_yH_z$.

16. The method of claim 15, wherein densifying includes subjecting each barrier layer to a plasma for about 35 seconds.

17. The method of claim 11, wherein forming the stack forms interfaces between each of the barrier layers in the stack.

18. The method of claim 11, wherein forming the stack includes depositing two to six barrier layers each having a pre-densification thickness of about 75 angstroms and a post-densification thickness of about 40 angstroms.

19. The method of claim 11, wherein the dielectric layer is a pre-metal dielectric layer and the method further includes;
- forming transistors over the semiconductor substrate prior to forming the dielectric layer;
- forming interlevel dielectric layers over the FERAM capacitors; and
- forming interconnects over and within the interlevel dielectric layers to interconnect the transistors and FERAM capacitors.

20. The method of claim 11, wherein the second barrier layer is formed by a deposition and densification process, and further wherein the second barrier layer has an elemental composition that is different from the first barrier layer.

21. The method of claim 11, wherein the second barrier layer comprises titanium aluminum nitride.

* * * * *